(12) United States Patent
Trantham et al.

(10) Patent No.: US 12,125,513 B2
(45) Date of Patent: Oct. 22, 2024

(54) SYSTEM ON CHIP (SOC) WITH PROCESSOR AND INTEGRATED FERROELECTRIC MEMORY

(71) Applicant: Seagate Technology LLC, Fremont, CA (US)

(72) Inventors: Jon D. Trantham, Chanhassen, MN (US); Praveen Viraraghavan, Chicago, IL (US); John W. Dykes, Eden Prairie, MN (US); Ian J. Gilbert, Chanhassen, MN (US); Sangita Shreedharan Kalarickal, Eden Prairie, MN (US); Matthew J. Totin, Excelsior, MN (US); Mohamad El-Batal, Superior, CO (US); Darshana H. Mehta, Shakopee, MN (US)

(73) Assignee: SEAGATE TECHNOLOGY LLC, Fremont, CA (US)

(*) Notice: Subject to any disclaimer, the term of this patent is extended or adjusted under 35 U.S.C. 154(b) by 187 days.

(21) Appl. No.: 17/726,864

(22) Filed: Apr. 22, 2022

(65) Prior Publication Data
US 2022/0343962 A1 Oct. 27, 2022

Related U.S. Application Data

(60) Provisional application No. 63/201,285, filed on Apr. 22, 2021.

(51) Int. Cl.
*G11C 11/22* (2006.01)
*G11C 7/10* (2006.01)
*G11C 17/12* (2006.01)

(52) U.S. Cl.
CPC ........ *G11C 11/2273* (2013.01); *G11C 7/1039* (2013.01); *G11C 11/2275* (2013.01); *G11C 11/2297* (2013.01); *G11C 17/12* (2013.01)

(58) Field of Classification Search
CPC ...................................................... G11C 17/12
See application file for complete search history.

(56) References Cited

U.S. PATENT DOCUMENTS

| | | |
|---|---|---|
| 5,495,438 A | 2/1996 | Omura |
| 5,539,279 A | 7/1996 | Takeuchi et al. |
| | (Continued) | |

FOREIGN PATENT DOCUMENTS

CN    1245761 C    3/2006

*Primary Examiner* — Douglas King
(74) *Attorney, Agent, or Firm* — HOLZER PATEL DRENNAN

(57) ABSTRACT

A system on chip (SOC) integrated circuit device having an incorporated ferroelectric memory configured to be selectively refreshed, or not, depending on different operational modes. The ferroelectric memory is formed of an array of ferroelectric memory elements (FMEs) characterized as non-volatile, read-destructive semiconductor memory cells each having at least one ferroelectric layer. The FMEs can include FeRAM, FeFET or FTJ constructions. A read/write circuit writes data to the FMEs and subsequently reads back data from the FMEs responsive to respective write and read signals supplied by a processor circuit of the SOC. A refresh circuit is selectively enabled in a first normal mode to refresh the FMEs after a read operation, and is selectively disabled in a second exception mode so that the FMEs are not refreshed after a read operation. The FMEs can be used as a main memory, a cache, a buffer, an OTP, a keystore, etc.

18 Claims, 9 Drawing Sheets

(56) References Cited

U.S. PATENT DOCUMENTS

| | | | |
|---|---|---|---|
| 5,592,409 | A | 1/1997 | Nishimura et al. |
| 5,729,488 | A | 3/1998 | Drab et al. |
| 5,966,318 | A | 10/1999 | Ramer et al. |
| 6,498,744 | B2 * | 12/2002 | Gudesen ................. G11C 11/22 365/65 |
| 6,574,135 | B1 * | 6/2003 | Komatsuzaki ........... G11C 7/06 365/210.12 |
| 6,900,497 | B2 | 5/2005 | Agarwal et al. |
| 6,924,663 | B2 | 8/2005 | Masui et al. |
| 7,864,558 | B2 | 1/2011 | Krieger |
| 9,484,924 | B2 | 11/2016 | Shin et al. |
| 10,109,339 | B1 * | 10/2018 | Akel ................... G11C 11/1675 |
| 10,153,368 | B2 | 11/2018 | Hatchet et al. |
| 2003/0156442 | A1 * | 8/2003 | Origasa .................... G11C 5/06 257/E25.011 |
| 2004/0062071 | A1 * | 4/2004 | Rodriguez .......... G11C 11/5657 365/145 |
| 2007/0070764 | A1 * | 3/2007 | Miyamoto .............. G11C 11/22 365/222 |
| 2008/0005451 | A1 * | 1/2008 | Tanigawa ........... G06K 19/0707 711/E12.078 |
| 2010/0026303 | A1 | 10/2010 | Nagatomo |
| 2011/0063903 | A1 * | 3/2011 | Kang ....................... G11C 8/08 365/163 |
| 2017/0277459 | A1 * | 9/2017 | Rodriguez ............ G11C 11/221 |
| 2018/0286475 | A1 * | 10/2018 | Wang ................ G11C 11/40615 |

* cited by examiner

FeRAM (1T-1C) FERROELECTRIC CAPACITOR MEMORY CELL

FERROELECTRIC TUNNEL JUNCTION (FTJ)

3D VERTICAL GATE (VG) NAND FeFET MEMORY

VERTICAL CROSS POINT FTJ MEMORY

3D VERTICAL FTJ MEMORY

SYSTEM ON CHIP (SOC) WITH PROCESSOR AND INTEGRATED FERROELECTRIC MEMORY

RELATED APPLICATION

The present application makes a claim of domestic priority under 35 U.S.C. 119(e) to U.S. Provisional Patent Application No. 63/201,285 filed Apr. 22, 2021, the contents of which are hereby incorporated by reference.

SUMMARY

Various embodiments of the present disclosure are generally directed to a system on chip (SOC) integrated circuit package that incorporates ferroelectric memory elements (FMEs) to provide local memory functions for an associated processor circuit.

In some embodiments, a system on chip (SOC) integrated circuit device has a processor circuit and an associated ferroelectric memory configured to be selectively refreshed, or not, depending on different operational modes. The ferroelectric memory is formed of an array of ferroelectric memory elements (FMEs) characterized as non-volatile, read-destructive semiconductor memory cells each having at least one ferroelectric layer. The FMEs can include FeRAM, FeFET or FTJ constructions. A read/write circuit writes data to the FMEs and subsequently reads back data from the FMEs responsive to respective write and read signals supplied by a processor circuit of the SOC. A refresh circuit is selectively enabled in a first normal mode to refresh the FMEs after a read operation, and is selectively disabled in a second exception mode so that the FMEs are not refreshed after a read operation. The FMEs can be used as a main memory, a cache, a buffer, an OTP, a keystore, etc.

These and other features and advantages of various embodiments can be understood with a review of the following detailed description in conjunction with the accompanying drawings.

DETAILED DISCUSSION

Figure 1:
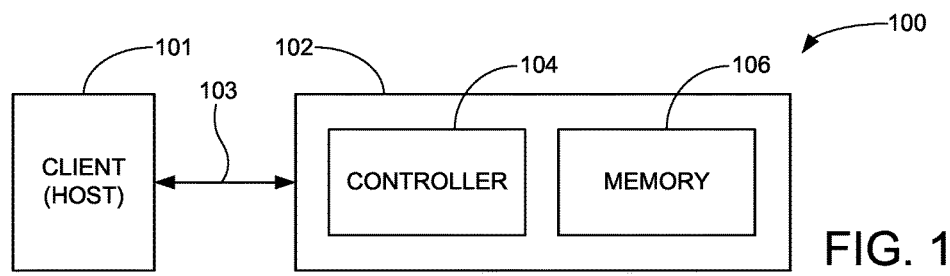
FIG. 1 is a functional block diagram of a data processing system constructed and operated in accordance with various embodiments.

Various embodiments of the present disclosure are generally directed to an integrated circuit (IC) that incorporates ferroelectric memory elements (FMEs) to provide local non-volatile storage of data for other circuit elements of the IC.

FMEs are semiconductor based memory elements that provide non-volatile data storage with fast response and low power consumption characteristics. A typical FME includes a stack of layers such as one or more conductive electrodes, a ferroelectric layer, a tunneling layer, an optional dielectric layer, etc. Data bit(s) are stored by an FME in relation to the programmed electric polarity of the ferroelectric layer of the element.

Different electrical polarities provide different current densities through the memory element as current is passed through the programmed ferroelectric layer. In this way, FMEs can be considered to operate in a manner similar to resistive random access memory (RRAM), phase change memory, spin-torque memory, etc., where a programmed state can be detected based on different electrical responses (e.g., different conductivity, current density, resistance, voltage drop, etc.) across the element.

A variety of FME constructions have been proposed. These include ferroelectric tunneling junctions (FJTs), ferroelectric field effect transistors (FeFETs), and ferroelectric random access memory (FeRAM). Other forms of FMEs have been proposed as well.

Generally, FTJs are somewhat analogous to magnetic tunneling junctions (MTJs) and are usually arranged as two-junction cells with a ferroelectric layer and a tunneling barrier layer sandwiched between opposing electrodes. FTJs are particularly suitable for cross-point arrays and other architectures with two connection points to each memory element.

FeFETs are somewhat analogous to flash memory cells and generally include a gate structure arranged between respective source and drain doped regions. The gate structure includes a ferroelectric layer. FeFETs usually have three-junctions (drain, source, gate) and can be readily arranged into two-dimensional (2D) or three-dimensional (3D) structures.

FeRAM cells are somewhat analogous to DRAM cells and are usually arranged with at least one transistor and at least one capacitor. The capacitor includes a ferroelectric layer. A tunneling barrier layer may also be provided in the capacitor as well. A number of FeRAM arrangements have been proposed, including 1T1FC (one-transistor, one-ferroelectric capacitor) cells, 2T2C cells, 1T4C cells, 6T4C cells, etc. The transistor in each FeRAM cell may be a traditional transistor (e.g., a conventional field effect transistor, FET), although in some cases ferroelectric layer(s) can be applied to the gate structure of the transistor as well as to the capacitor ("dual layer FeRAM").

A variety of materials, metals and alloys can be used to make up the respective ferroelectric, tunneling and electrode layers. Suitable materials for the ferroelectric layer can include, without limitation, $HfO_2$, $ZrO_2$, $Hf_{1-x}Zr_xO_2$, etc. These materials may be doped with other elements such as but not limited to Si, Ge, Al, Ti, Sc, Y, La, Ce, Gd, Nb, Sr, Ba, N, etc. The tunneling layer(s) may be a suitable non-ferroelectric dielectric including, but not limited to $Al_2O_3$, MgO, $SrTiO_3$, etc. Electrodes are electrically conductive material and may include, without limitation, TiN, TaN, Pt, Ag, CrRu, CrMo, CrW, CrTi, and RuAl. In some cases, anti-ferroelectric materials such as $ZrO_2$ may be used in the place of the ferroelectric layer if an internal bias field, e.g., from two dissimilar electrodes, is introduced in order to shift its hysteresis loop to enable the storage of binary information. These and other examples are merely illustrative and are not limiting.

It has been found that the types of materials that can be incorporated into FMEs are well adapted for use in otherwise conventional semiconductor fabrication processes of the type used to fabricate other semiconductor circuit elements. This presents an opportunity to incorporate various types of FMEs (e.g., FTJs, FeFETs. FeRAMs, etc.) into larger integrated circuit (IC) circuits and designs specific to the area of data storage devices (e.g., SSDs, etc).

Various embodiments of the present disclosure are generally directed to a method and apparatus for incorporating FMEs into an integrated circuit (IC) with other forms of circuit elements into the same IC package. In this way, a simple or complex IC, with gate logic, programmable processors, etc. can be provided with integrated memory using the same fabrication processes to form both the FMEs and the other circuit elements. As used herein, the IC package can be generally referred to as a specially configured, FME based, system on chip (SOC) style device.

There are a number of features of FMEs that provide particular advantages to such integration. The elements provide non-volatile memory (NVM) storage of one or more bits with a relatively stable storage/refresh rate Like DRAM, many (or all) FMEs, regardless of type, are read-destructive so that the storage state of the cells are lost when read. The FMEs thus normally require a write-after-read to refresh the previous stored state; that is, once the data are read, a follow-up refresh (rewrite) operation is performed to return the FMEs to their previous storage state.

FME elements are extremely fast, so that read/program rates can be in the nanosecond range or faster, generally comparable to DRAM and other fast memory devices. FME elements are also extremely low power including during write operations, read operations, and maintenance operations. For example, FME read and write power consumption levels are comparable to DRAM and significantly lower than SRAM, flash, etc.; FME ongoing refresh power consumption is essentially nonexistent, unlike DRAM, NVRAM, etc.

Accordingly, as disclosed herein these characteristics of FMEs can provide a number of novel uses for the memory elements within the confines of a larger IC, such as internal memory, keystores, OTP (one time programmable fuses), destructive memory (e.g., one-use memory where the contents are destroyed once the contents are accessed if a refresh is not applied), and so on.

The present disclosure contemplates substantially any integrated memory in any existing or future planned systems can be provided with FMEs. These can include SRAM, memory buffers, write cache, read buffers, main memory, etc. The elements can be used in a stand-alone fashion or used to mirror/backup other volatile or non-volatile storage. The elements can be arranged in any suitable form including FTJs, FeFETs or FeRAM, and in 2D or 3D configurations.

It is contemplated that the FMEs can be used to provide a synergistic advantage over conventional memory elements, over and above the fact that FMEs are rewritable and non-volatile. This can be applied to both controller and memory module applications. Examples include but are not limited to internal cache (SRAM replacement), external read and write cache/buffer (DRAM and flash memory replacement), registers, keystores, FME/flash die front end buffers, etc.

Some disclosed embodiments eliminate the need to load configuration data from the main flash store to local memory, such as map data used to identify the locations of user data in a main memory store. Other embodiments take advantage of the read-destructiveness of FMEs by providing an area that stores a one-time use data value or element (e.g., an authentication value, an encryption key, etc.), and reading the data to retrieve it and simultaneously wiping the memory (e.g., not performing a refresh rewrite).

Yet another example uses the FMEs as internal or external memory (in a manner similar to SRAM, DRAM, flash write cache, etc.) and to purposefully read without refresh to clear these memories as a result of a particular condition (attack, power down, etc.). A specially configured refresh circuit can be operated in different modes, including a mode where the data read out from the memory are refreshed (rewritten) and a mode where the data read out from the memory are not refreshed (rewritten) based on command control inputs from a control circuit.

Substantially any existing fabrication process, scaling and sizing can be used to incorporate the FMEs into an SOC. This allows the FMEs to be economically and efficiently incorporated into substantially any existing chip design, and used in any number of different applications to provide secure storage of data for the associated processing circuitry in the chip device.

These and other features and advantages of various embodiments will now be discussed beginning with a review of FIG. 1, which shows a generalized functional block diagram for a data processing system 100. Other operational environments are contemplated and will readily occur to the skilled artisan in view of the present discussion, so it will be understood that FIG. 1 is merely illustrative and not limiting.

The system 100 includes a client (host) device 101 that communicates with a data storage device 102 via an interface 103. The client device 101 can take substantially any suitable form including but not limited to a personal computer, a smart phone, a workstation, a tablet, a laptop, a gaming system, a microcontroller, a server, an edge device, an Internet of Things (IoT) device, a storage controller, a router, etc. It is contemplated albeit not required that the client 101 is a user device accessed by a user either directly or indirectly via an upstream communication device.

The data storage device 102 is configured to store and retrieve data utilized by the user of the client device 101 and may be a local processor memory, a data cache, a server cache, a RAID storage system, a cloud storage system, a solid-state drive (SSD), a hard disc drive (HDD), a hybrid storage device, an array of storage devices, a portable thumb (e.g., USB) drive, etc. The interface 103 can take substantially any form including but not limited to a local wired or wireless interface, a local area network (LAN), a wide area network (WAN), a cloud computing interface, the Internet, etc.

Of interest is the data storage device 102, which is shown to include a controller 104 and a memory 106. The controller 104 can include one or more programmable processors that execute program instructions stored in a local memory to carry out various functions, including the control of data transfers between the memory 106 and the client 101 across the interface 103. As desired the controller 104 can additionally or alternatively be realized using hardware circuits.

The memory 106 can include any number of useful forms including local memory for the controller, cache memory, buffer, main storage, etc. While not limiting, it is contemplated that the memory 106, or a portion thereof, will include ferroelectric memory to provide non-volatile memory (NVM) storage for data utilized or otherwise processed by the controller 104. As will be recognized by skilled artisans, the term "non-volatile" describes a memory that continues to retain information stored therein even after the removal of applied power. This is in contrast to "volatile" memory, which quickly dissipates and loses any stored information upon the removal of applied power. The terms "volatile" and "non-volatile" will be understood in accordance with the ordinary usage in the applicable art.

Figure 2:
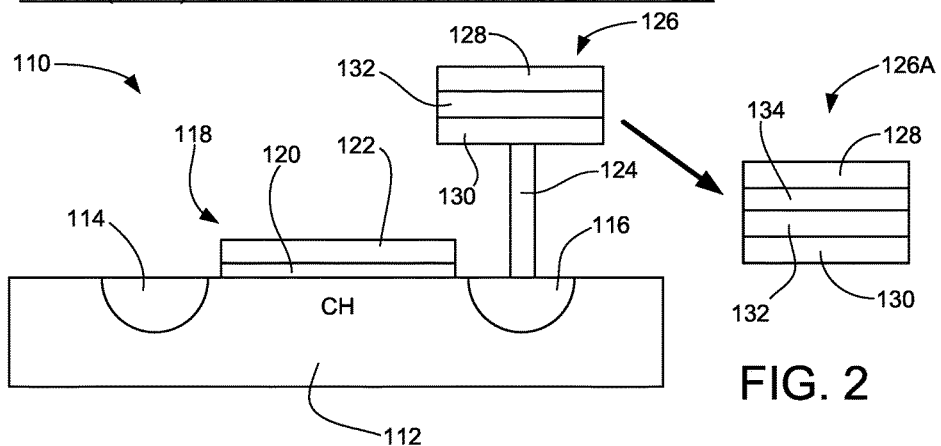
FIG. 2 is a schematic depiction of a one transistor, one capacitor (1T-1C) ferroelectric capacitor memory cell in some embodiments.

FIG. 2 is a schematic representation of a ferroelectric random access memory (FeRAM) memory cell 110 to illustrate one form of memory cell that can be incorporated in the memory 106 of FIG. 1 in accordance with some embodiments. The FeRAM memory cell 110, also sometimes referred to as a ferroelectric memory cell or an FME, has a one transistor, one capacitor (1T-1C) configuration. Other FeRAM configurations can be used.

The FME 110 can be used as a replacement for conventional DRAM memory cells, and exhibits comparable or improved performance over such DRAM cells. The FME 110 includes a semiconductor substrate 112 with respectively doped source 114 and drain 116 regions. An intervening channel region (CH) extends therebetween adjacent a gate structure 118. It is contemplated although not necessarily required that the substrate 112 may be p doped and the source and drain regions 114, 116 may be n doped.

The gate structure 118 includes an interlayer 120 and a conductive control gate region 122. An interconnect structure 124 supports a capacitive structure 126 including opposing capacitive plates 128, 130 separated by an intervening ferroelectric layer 132. While FIG. 2 shows a planar capacitor with flat conductive electrodes and an intervening ferroelectric layer, an extended three-dimensional (3D) structure can be used, such as by using concentric electrode and ferroelectric layers (e.g., rings, etc.).

An alternative construction for the capacitive structure can be provided, as depicted by alternative capacitive structure 126A in FIG. 2. In this case, it may be advantageous to insert a nonferroelectric layer 134, such as a dielectric layer, next to the ferroelectric layer 132 and between the capacitive plates 128, 130. The non-ferroelectric layer 134 may be adjacent either capacitive plate (e.g., above or below the ferroelectric layer 132) as required.

The FME 110 is an NVM memory cell that encodes information in the direction of the electric polarization of the ferroelectric material that makes up layer 132. As noted above, one suitable material for the layer 132 is, or comprises, hafnium oxide (HfO2), which can retain ferroelectricity in film thicknesses under 10 nm, can be deposited conformally via atomic layer deposition, and enables fabrication in a number of different high-density three-dimensional memory architectures such as described below.

Existing DRAM fabrication processes can be used to generate memory cells such as 110 but with the substitution of a ferroelectric material such as HfO2 for the layer 132 to form NVM modules with the same, or better, properties than conventional DRAM. Other suitable ferroelectric materials for the layer 132 can be used. As noted above, these can include, but are not limited to, combinations or alloys that include HfO2, ZrO2, Hf1-xZxO2, or other materials or alloys. These materials may be doped with other elements, e.g., Si, Ge, Al, Ti, Sc, Y, La, Ce, Gd, Nb, Sr, Ba, N, etc., for improved ferroelectric properties.

As will be recognized by those skilled in the art, a conventional DRAM memory cell stores data in terms of the presence or lack of an electrical charge in the capacitor (e.g., structure 126), with the lack of charge in general representing a first logical value (e.g., logical 0), and the presence of charge representing a second logical value (e.g., logical 1). Other conventions can be used.

Programming a DRAM memory cell can be carried out by activating the associated control transistor, draining the cell to write a logical 0, or applying current to write a logical 1. Reading the DRAM memory cell involves activating the transistor and draining the charge from the capacitor to a sense amplifier. If a pulse of charge is detected, the state is determined to be a logical 1; if no pulse of charge is detected, the state is determined to be logical 0. It will be noted that the read operation is destructive, so that if a logical 1 is detected the capacitor is recharged to restore the stored value. As noted above, the leaking nature of a typical DRAM cell requires continual read and refresh operations to retain the stored information.

The 1T-1C FME 110 operates in a similar fashion. To program the FME 110, an applied electric field across the layer 132 via electrodes 128, 130 causes dipoles in the layer 132 to align with the applied field direction (e.g., up or down). However, unlike a typical DRAM cell, once the electric field is removed, the dipole alignment is retained within the layer 132 of the ferroelectric cell 110. Logical 0 and 1 states are programmed responsive to the polarization of the layer 132.

To subsequently read the cell 110, the transistor is placed in a conductive source-drain state. If the layer 132 is in a first logical state (e.g., logical 0), no pulses will be detected by a sense amplifier connected to the transistor. If the layer 132 is in a second logical state (e.g., logical 1), the re-orientation of the atoms in the layer 132 will induce a small pulse of current, which can be detected as before. Depending on the ferroelectric material used, the reading process may or may not be destructive, so a refresh operation may or may not be required to restore the previous state.

Figure 3:
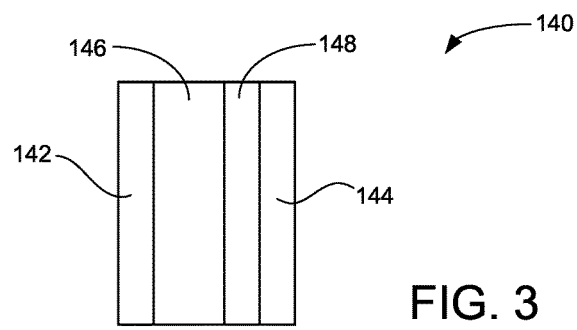
FIG. 3 depicts a ferrolectric tunnel junction (FTJ) in some embodiments.

While the present disclosure contemplates the use of ferroelectric memory in a memory cell such as disclosed in FIG. 2, other configurations are contemplated that can further enhance the efficiency and performance of a memory. FIG. 3 shows a schematic representation of a so-called ferroelectric tunnel junction (FTJ) 140. The FTJ 140 is another form of FME characterized as a two-terminal device with outer conductive electrode layers 142, 144, an inner (programming) layer of ferroelectric material 146, and an optional tunnel barrier layer 148. The tunnel barrier layer 148 is contemplated but not necessarily required as a separate layer, and may be any suitable material such as but not limited to a non-ferroelectric material, a dielectric material, etc.

With the appropriate choice of electrode materials, tunnel barrier, and ferroelectric layer, the resistance of the FTJ can be made to depend on the orientation of the ferroelectric polarization of the ferroelectric layer 146. Stated another way, an FTJ such as the FTJ 140 operates in a manner similar to magnetic tunnel junctions (FTJs), and will present different electrical resistances between electrodes 142, 144 based on the programmed polarization of the ferroelectric layer 146. The differences in electrical resistance will vary depending on construction, but differential resistance values can be greater than $10^4$ ohms.

The programmed state of the ferroelectric layer 146 can be established by supplying a voltage of suitable amplitude, duration and polarity across the respective electrode layers 142, 144. A first polarity provides the layer 146 with a first, higher electrical resistance, and an opposing second polarity provides the layer 146 with a second, lower electrical resistance. The programmed states of the layer 146 can be accomplished and reversed (overwritten) using moderate magnitudes and dwell times.

This can accordingly provide an efficient and effective way to detect programmed states within the FTJ (e.g., a high resistance is a first logical value, a low resistance value is a different logical value). At this point it will be understood that the particular construction of each of the respective layers 142-148 is not limited, so long as the ferroelectric polarization of layer 146 establishes different electrical resistances between electrodes 142 and 144. Example materials are noted above. As before, the read operation may be destructive or non-destructive, so that a refresh operation may or may not be required.

Figure 4A:
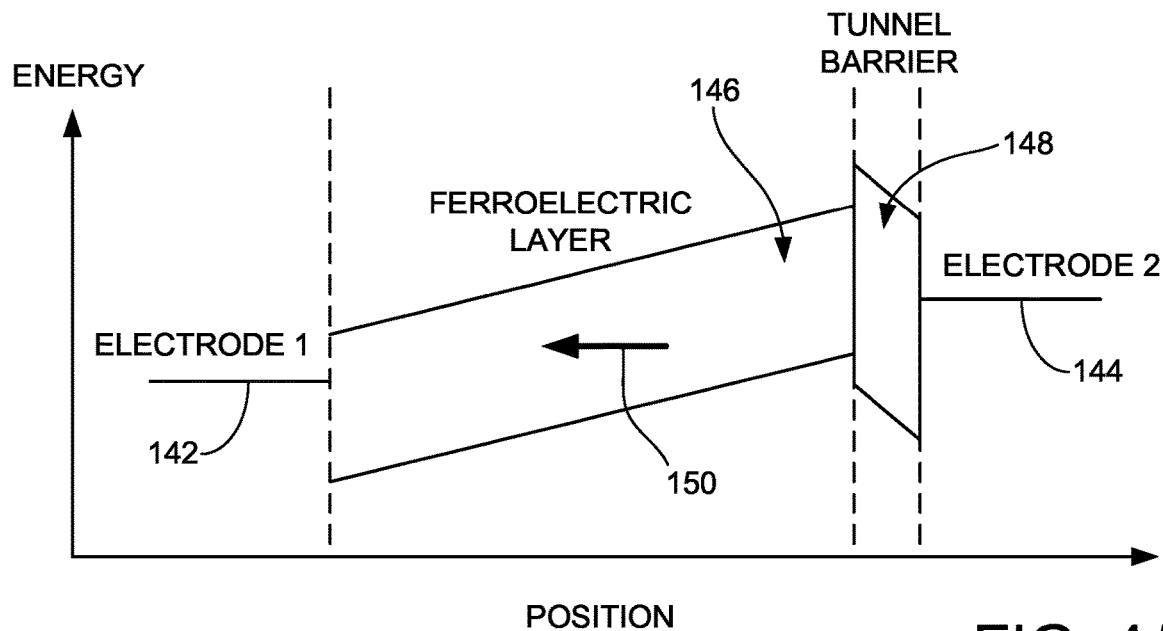
FIGS. 4A and 4B are graphical depictions of band diagrams to illustrate operation of the FTJ of FIG. 3 in some embodiments.
Figure 4B:
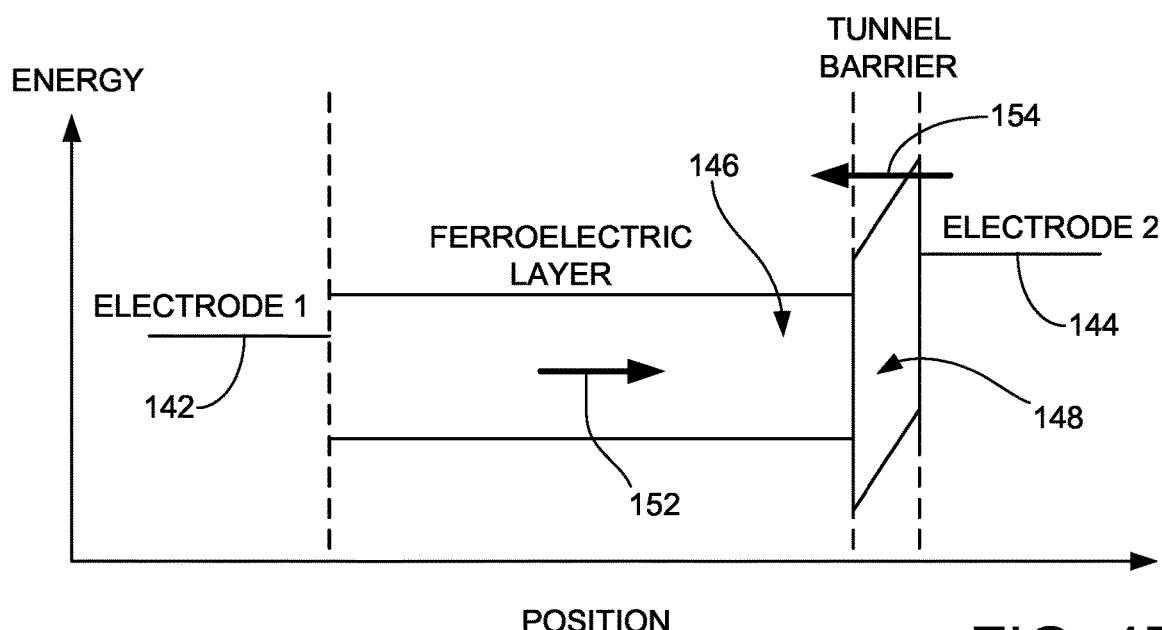

FIGS. 4A and 4B show graphical representations of the operation of an FTJ such as the FTJ 140 in FIG. 3 in accordance with some embodiments. FIG. 4A shows the programmed state of the FTJ in a first direction (as indicated by polarization arrow 150) and FIG. 4B shows the programmed state of the FTJ in an opposing second direction (polarization arrow 152). Arrow 154 indicates electrical current flowing when the barrier height is reduced by appropriate orientation of the ferroelectric polarization. Other forms of FMEs can have similar hysteresis characteristics.

Figure 5:
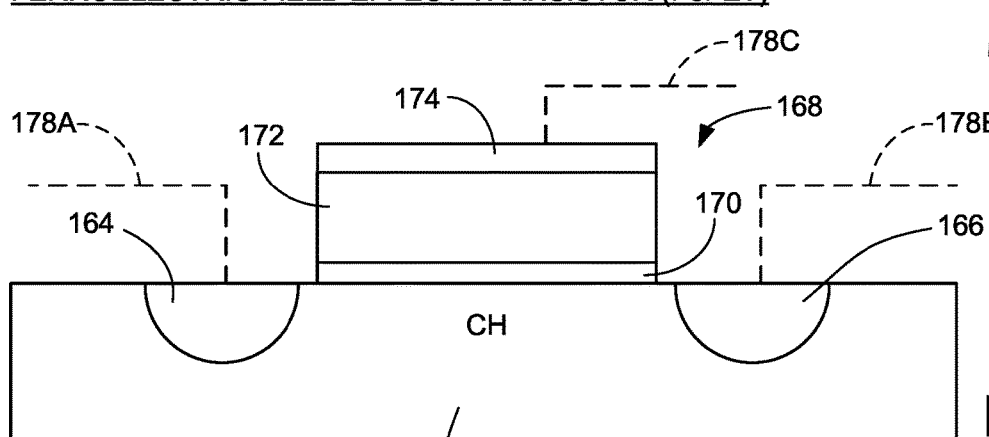
FIG. 5 shows a ferroelectric field-effect transistor (FeFET) constructed and operated in accordance with some embodiments.

FIG. 5 shows another embodiment of an FME characterized as a ferroelectric field-effect transistor (FeFET) 160 is created by replacing the gate dielectric material of a conventional FET with HfO2 (or other suitable ferroelectric material). It will be appreciated that the FeFET 160, as well as the other structures illustrated in the various drawings in the present discussion, are not necessarily drawn to scale.

The FeFET 160 in FIG. 5 includes a substrate 162 similar to the substrate 112 in FIG. 2. Respective source and drain regions 164, 166 form a channel (CH) adjacent a gate structure 168. The gate structure 168 includes an interlayer 170, a ferroelectric layer 172 and a gate layer 174. The interlayer 170 can also be characterized as a tunnel barrier layer. Respective conductive (electrode) layers 176A, 176B and 176C (represented via broken lines) are provided to interconnect the respective source, drain and gate regions of the FeFET 160 to control and sensing circuitry (not separately shown in FIG. 5).

Figure 6A:
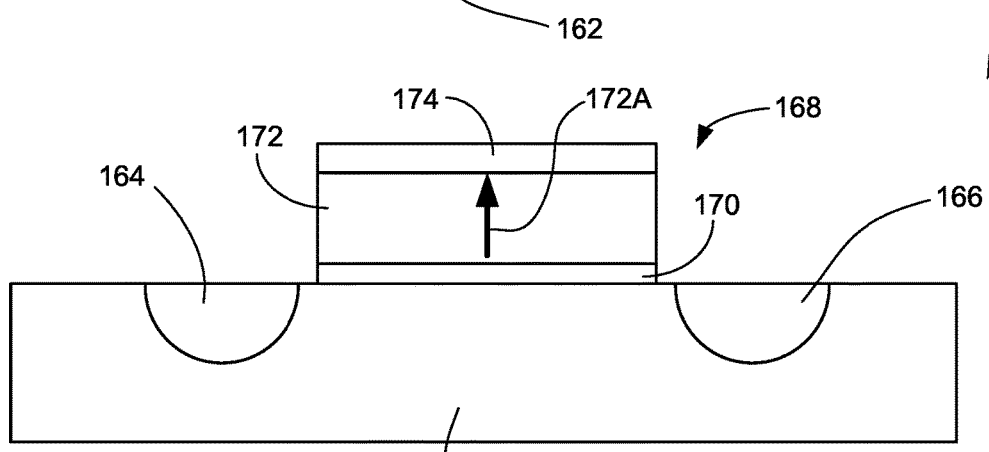
FIGS. 6A and 6B illustrate operation of the FeFET of FIG. 5 in some embodiments.
Figure 6B:
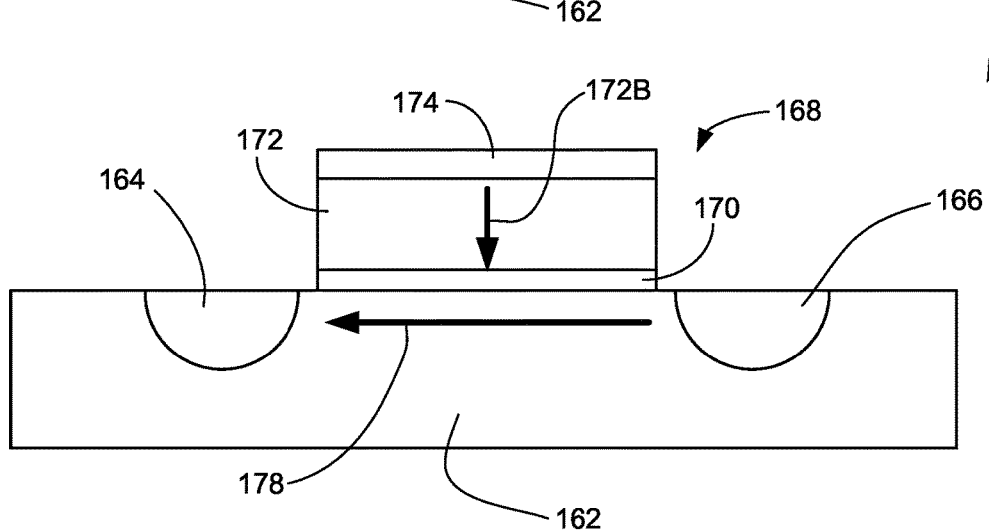

The ferroelectric polarization of layer 172 modulates the carrier concentration in the transistor channel depending on its programmed orientation, providing a transistor whose source-drain current depends on the history of program/erase pulses provided to the gate, yielding low-latency, nonvolatile storage. More particularly, FIG. 6A shows the FeFET 160 with the ferroelectric layer 172 programmed in a first direction (arrow 172A), resulting in a first conductivity level through the source-drain channel. FIG. 6B shows the FeFET 160 with the ferroelectric layer 172 programming in the opposing second direction (arrow 172B). As indicated by current flow arrow 178 in FIG. 6B, the second programming state 172B provides higher conductivity (lower resistance) as compared to the first programming state 172A. The programmed state of the cell can be determined responsive to the sensed flow of source-drain current.

The FeFET 160 shown in FIGS. 5 and 6A-6B provides the ferroelectric layer in the transistor gate structure 168, rather than in the separate capacitor structure of the FeRAM memory cell 110 in FIG. 2. In other words, the FeRAM cell 110 in FIG. 2 uses an otherwise conventional FET as the transistor structure and relies upon the ferroelectric behavior of the capacitor to provide the ferroelectric characteristics. In further embodiments, a FeRAM memory cell such as described in FIG. 2 can be arranged to include a FeFET such as 160 in FIG. 5 as the transistor. This provides both the transistor and the capacitor with respective ferroelectric layers (a so-called "dual layer FeRAM" memory cell), so that both the transistor and the capacitor (or the multiple transistors and/or multiple capacitors) in the dual layer FeRAM cell each have at least one associated ferroelectric layer.

As mentioned previously, the present disclosure contemplates several variations on the ferroelectric film or film stack used in FeRAMs, FTJs and FeFETs, all of which fall within the scope of this disclosure. The ferroelectric material may be, but is not limited to HfO2, ZrO2, Hf1-xZxO2, or other materials and alloys thereof. These materials may be doped with other elements, e.g., Si, Ge, Al, Ti, Sc, Y, La, Ce, Gd, Nb, Sr, Ba, N, etc., for improved ferroelectric properties. The conductor used as the electrode of an FTJ or the gate of a FeFET can also be selected to promote the formation of the ferroelectric orthorhombic phase of HfO2 as well as to create a level of strain appropriate for enhancing ferroelectric properties. Suitable materials may include, but are not limited to, TiN, TaN, Pt, Ag, CrRu, CrMo, CrW, CrTi, and RuAl.

A subsequent annealing step may be necessary to develop the appropriate crystal structure in the ferroelectric layer. FTJs can benefit from some form of asymmetry to operate properly, which may be achieved by providing electrodes of dissimilar materials (e.g., different work functions). The ferroelectric layer may be a single ferroelectric film, a multilayer comprised of ferroelectric materials of different combinations, or a multilayer comprised of both ferroelectric and dielectric films. Such multilayers enable the memory cell to be programmed to multiple levels for operation analogous to multi-level NAND flash (e.g., MLC, TLC, QLC, etc.) where $2^N$ discrete program levels are used to store N bits (e.g., a TLC uses 8 levels to program 3 bits, a QLC uses 16 levels to program 4 bits, and so on).

The addition of a dielectric (tunnel barrier) layer (e.g., Al2O3, MgO, SrTiO3, etc.) to an FME stack may be desirable to allow for greater tenability by partially decoupling the tunneling properties from the ferroelectric properties. An antiferroelectric layer (e.g., ZrO2) may be used in the place of the ferroelectric layer if an internal bias field, e.g., from two dissimilar electrodes, is introduced in order to shift its hysteresis loop to enable the storage of binary information. While specific examples of material stacks are given in the embodiments below, any of the variations described here may be substituted while remaining within the scope of this disclosure.

The following discussion will now address specific embodiments that can utilize FMEs as described above in novel three-dimensional (3D) architectures. These can include NAND, NOR, and cross-point arrangements to provide non-volatile, low-latency memory with a scaling path that extends far beyond the density limits of current generation 1T-1C DRAM designs.

Figure 7:
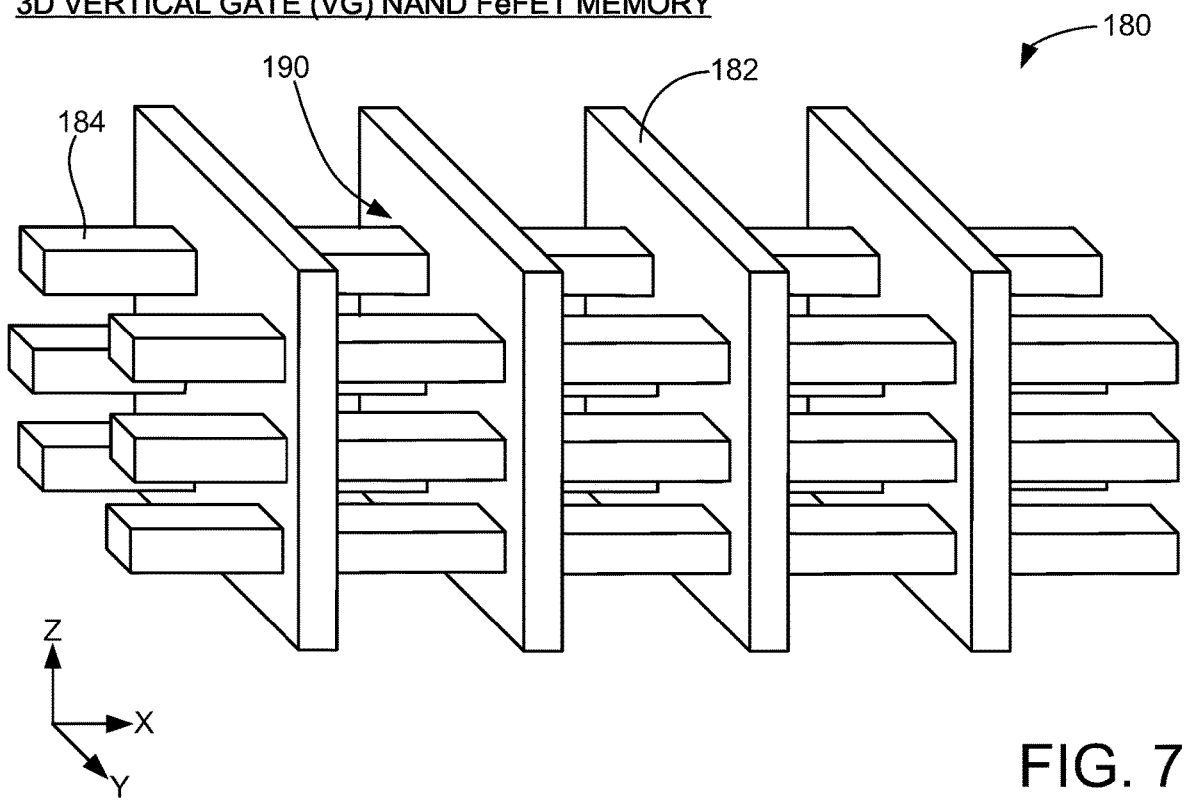
FIG. 7 is a three-dimensional (3D) isometric depiction of a vertical gate (VG) NAND FeFET memory in accordance with some embodiments.
Figure 8:
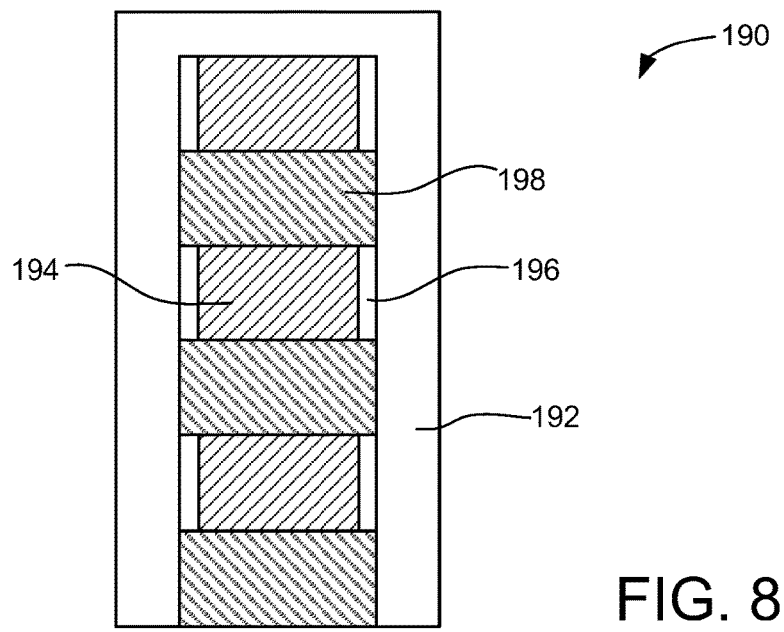
FIG. 8 is a cross-sectional representation of a selected FeFET from FIG. 7.

FIG. 7 is an isometric representation of a portion of a 3D vertical gate (VG) NAND FeFET memory 180 in accordance with some embodiments. This embodiment utilizes FeFETs arranged in a three-dimensional vertical-gate NAND architecture. FIG. 8 shows a cross-section of a selected one of the FeFETs depicted in FIG. 7.

Vertically extending layers 182 represent gate structures (vertical gates, or VGs). Horizontally extending layers 184 represent active layers. FeFETs 190 are arranged at each intersection of a corresponding pair of vertical and horizontal layers 182, 184. It will be noted that the FeFETs 190 are arranged in a 3D spaced apart relation along multiple orthogonal axes (e.g., axes X, Y and Z as shown). This same relation is provided for each of the embodiments to follow below.

One FeFET 190 from FIG. 7 is depicted in the cross-sectional view of FIG. 8. Composite elements shown in FIG. 8 include a vertical gate 192 (portion of 182), active strips 194 (portion of 184), ferroelectric layers 196, and insulating layers 198.

3D VG NAND structures such as 180 can be fabricated using fabrication methods that are currently used to form charge-trapping (ONO) flash memory cells (with the changes described herein to provide FeFET based memory arrays). An example fabrication process can be described as follows.

First, CMOS peripheral circuitry (switches, decoders, sense amps, etc.) are fabricated on an underlying substrate (wafer). Alternating, repeating layers of a doped semiconducting material such as p-doped polysilicon and an insulating material such as silicon oxide are deposited. Next, vertical trenches are etched through all the layers. At this point, for conventional 3D VG NAND with charge trapping memory cells, charge trapping layers (e.g., ONO) are conformally deposited on the side walls of the trenches and appropriate select transistors are formed at the ends of the strings via ion implantation or similar process.

A conducting material, e.g., doped polysilicon, is deposited in the trenches and patterned into word line planes perpendicular to the trenches defining the horizontal channels. In this embodiment, instead of a charge trapping layer, a ferroelectric layer, e.g. an 8 nm film of Hf0.5Zr0.5O2 is deposited. This is followed by deposition of an appropriate material, e.g., TiN, to promote development of ferroelectric orthorhombic Hf0.5Zr0.5O2, which is then patterned into word line planes.

Programming is accomplished by applying a positive programming pulse (e.g., +10V) to the word line of the selected cell while holding the channel at 0 V. A smaller inhibit voltage (e.g., +5 V) may be applied to the active layers of bits sharing the same word line so that they are not disturbed by the program operation.

Erasing is accomplished by applying an electric field of opposite polarity, e.g., +10 V to the channel while grounding the word line, or −10 V to the word line while grounding the channel. Again, appropriate inhibit voltages must be applied to the other transistors sharing the same word line so that they are not disturbed by the erase operation.

A cell is read by applying a small pass voltage (e.g., 3 V) to all the transistors sharing an active layer with the transistor to be read (e.g., pass voltage is applied to the rest of the NAND string), and the resulting cell current is measured while the gate voltage of the transistor of interest is swept. The gate voltage at which the transistor turns on may be identified by sense amplifiers and other CMOS peripheral circuitry and can be compared either to a single threshold for SLC operation or to multiple thresholds so that multiple bits may be recorded in each memory cell.

For faster read performance, multiple cells, such as two cells, may be used per bit, with each cell programmed differently (one cell programmed high and the other cell programmed low for a 1, and vice-versa for a 0). On a read, the stored value can be determined by sensing the two cells differentially. Other arrangements can be used. Note that these various SLC, MLC, and ½-bit per cell arrangements, as well as other storage arrangements, also apply to the other embodiments presented herein.

Figure 9:
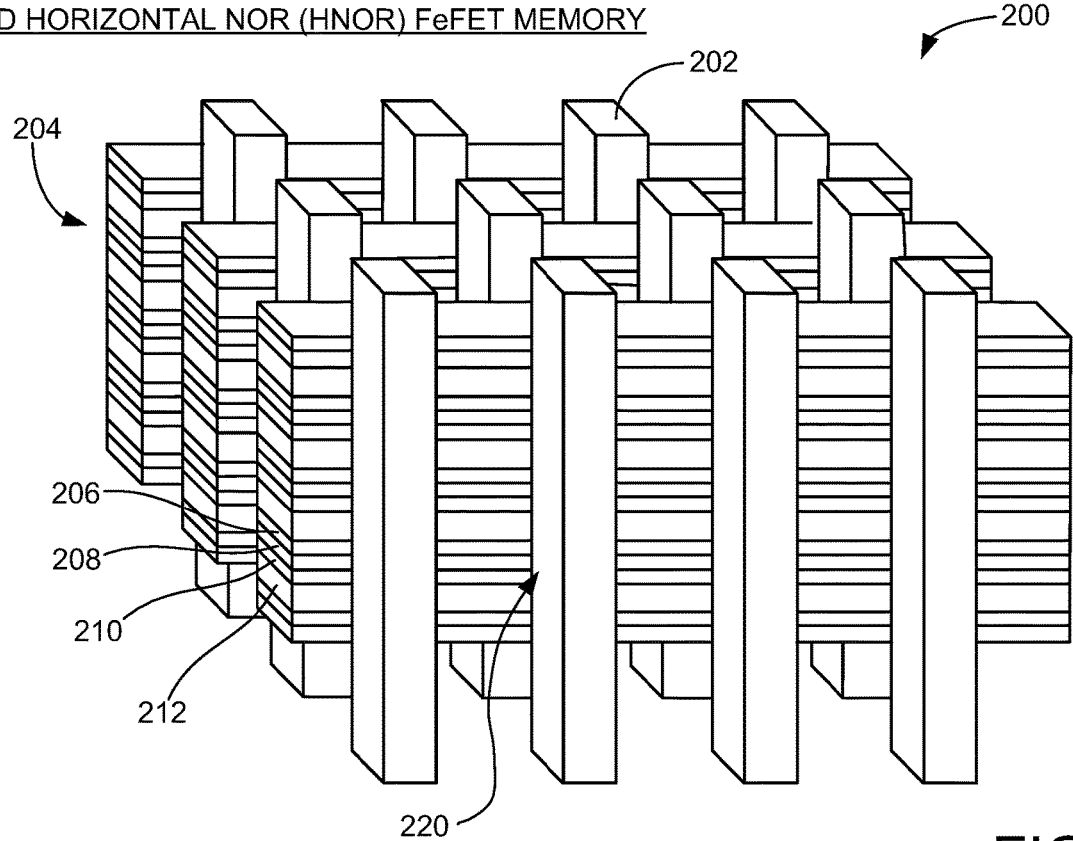
FIG. 9 is a 3D isometric depiction of a horizontal NOR (HNOR) FeFET memory in accordance with some embodiments.

FIG. 9 shows an isometric schematic depiction of another memory 200 constructed and operated in accordance with some embodiments. The memory 200 in FIG. 9 is characterized as a three-dimensional (3D) horizontal NOR (HNOR) FeFET memory array. This arrangement is suitable as a NOR flash replacement, as well as in other applications, and can be readily fabricated using existing processes (as modified herein) well known to those skilled in the art. A cross-sectional view of one of the FeFETs in FIG. 9 is provided in FIG. 10.

Elements in the memory 200 shown in FIG. 9 include vertically extending layers 202 configured to operate as word lines. A number of stacks 204 are coupled between adjacent sets of the vertical layers 202. Each stack includes respective, multiple sets of drain layers 206, bit lines 208, source layers 210, and channel/isolation layers 212. FeFETs 220 are located at the conjunction of each vertically extending layer and each horizontally extending set of layers, as indicated by arrow 220.

Figure 10:
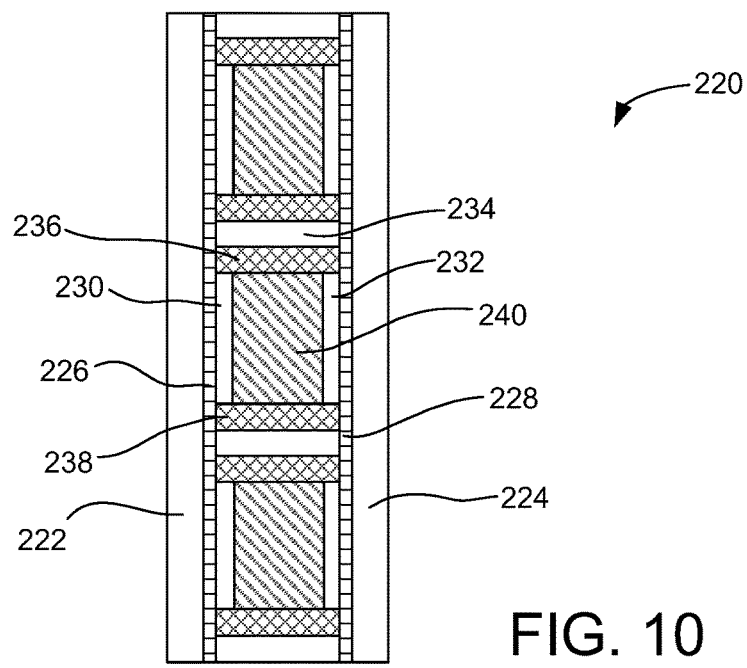
FIG. 10 is a cross-sectional representation of a selected FeFET from FIG. 9.

FIG. 10 shows a number of stacked FeFETs 220 from FIG. 9. Depicted regions include a left-side word line 222; a right-side word line 224; ferroelectric layers 226, 228; a left-side channel 230; a right-side channel 232; bit, source and drain lines 234, 236, 238; and interior isolation regions 240.

An exemplary fabrication process to form the memory 200 of FIGS. 9-10 can be as follows. First, CMOS peripheral circuitry (decoders, sense amps, etc.) are fabricated on an underlying wafer. Repeating layers of N+, P−, N+ polysilicon and optionally metal (e.g., W) bit lines are deposited. The N+ layers form the sources and drains of the memory cell transistors, while the edges of the P− layers form the channels. The metal reduces the bit line resistance and consequently the RC delay associated with the bit line, thus reducing the latency.

Stacks of bit lines are separated by etching vertically down to the substrate. The transistor gates are deposited conformally (e.g., via atomic layer deposition (ALD)). In the prior art, the gate structure was, e.g., a charge trap layer (ONO). In this embodiment, a conformally-deposited ferroelectric layer is used instead. A variety of materials and structures may be used for the ferroelectric film. By way of example, an 8 nm layer of Hf0.5Zr0.5O2 may be used.

After the ferroelectric film is deposited, metal gates and word lines are deposited and patterned. The metal may be chosen to produce the appropriate crystalline texture to promote the formation of the ferroelectric orthorhombic phase of HfO2 and related ferroelectrics. These materials include, but are not limited to, TiN, Pt, Ag, CrRu, CrMo, CrW, CrTi, and RuAl. A subsequent annealing step may be necessary to develop the appropriate crystal structure in the ferroelectric layers.

Programming of the respective FeFETs 220 can be accomplished by applying a positive programming voltage pulse (e.g., +10V) to the word line of the selected transistor while holding the source and drain (bit line) of the selected transistor at 0 V. The bit lines of the unselected transistors are held at an intermediate inhibit voltage (e.g., +5V) to prevent them from being written. An erase operation simply reverses the program operation, either with a negative voltage (e.g., −10V) applied to the gate while holding the source and drain at 0, or with a positive voltage (e.g., +10V) applied simultaneously to the source and drain while the gate is grounded. In either erase scheme, appropriate inhibit voltages must again be applied to the unselected transistors to prevent their state from being disturbed.

Reading a memory cell is accomplished by applying a small, positive voltage (e.g., +0.5 V) to the drain and holding the source at 0V while a small voltage (e.g., 2 V) may be applied to the gate of the selected transistor as well. To prevent other cells sharing bit lines with the selected cell from also being read, the gates of these cells are held at 0 V by grounding their word lines. The state of the memory cell is determined by measuring the current flowing through the selected cell, e.g., with sense amplifiers and other peripheral CMOS circuitry familiar to one of ordinary skill in the art.

Figure 11:
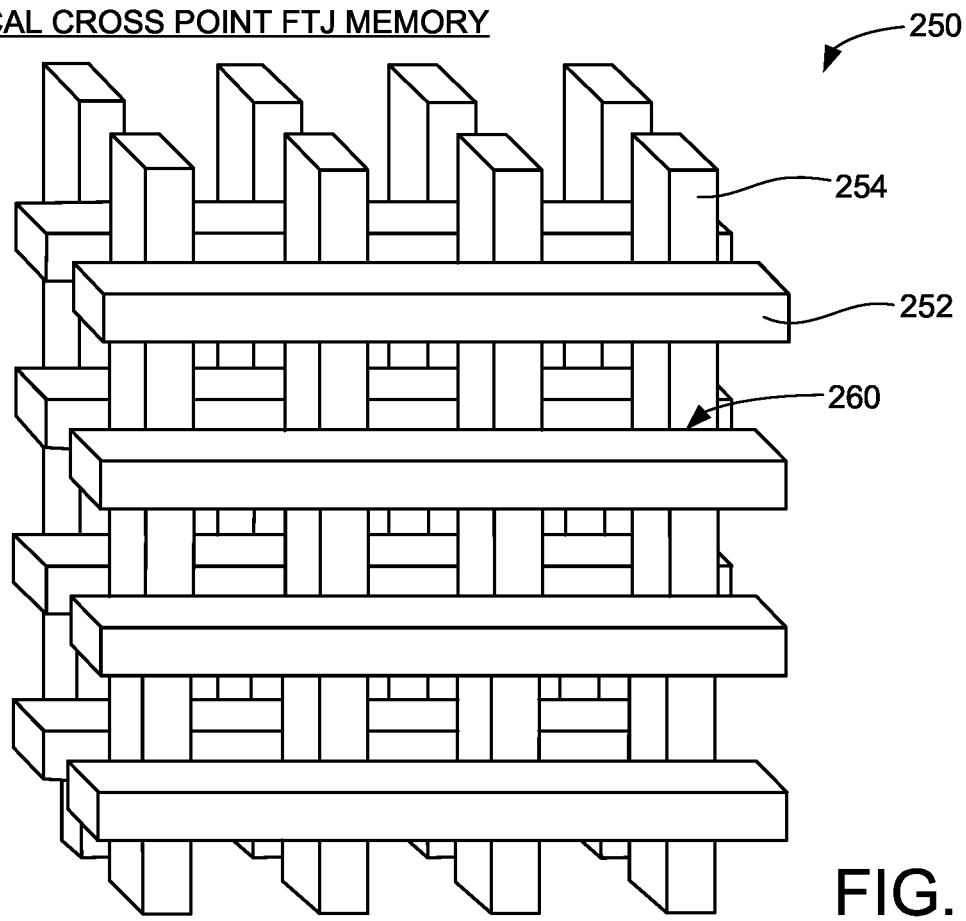
FIG. 11 is a 3D isometric depiction of a vertical cross point FTJ memory in accordance with some embodiments.

FIG. 11 provides another alternative embodiment comprising a vertical cross point FTJ memory 250. Unlike the previous embodiments that utilized FeFET constructions, this embodiment is directed to FTJs similar to the FTJ 140 in FIG. 3. The memory 250 includes horizontal layers 252 characterized as bit lines and vertical layers 254 characterized as word lines. FTJs are located at each junction, as generally indicated at 260.

Figure 12:
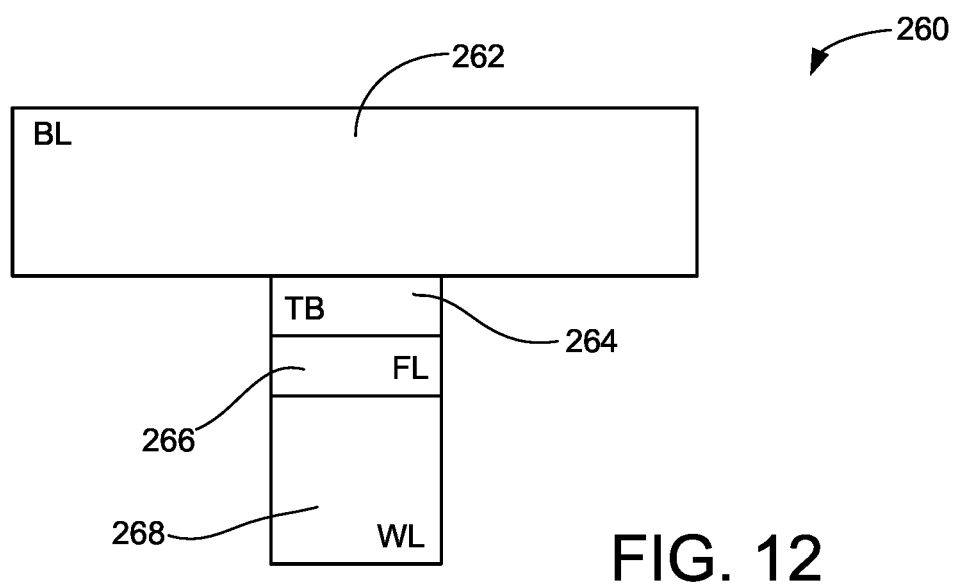
FIG. 12 is a cross-sectional representation of a selected FTJ from FIG. 11.

FIG. 12 provides a cross-sectional representation of a selected FTJ 260 from FIG. 11. The FTJ includes a bit line (BL) 262, a tunnel barrier (TB) layer 264, a ferroelectric layer (FL) 266 and a word line (WL) 268. This facilitates a simple and highly dense construction since, in essence, the tunnel barrier and ferroelectric layers 264, 266 are sandwiched between each junction of bit and word lines 262, 264.

The memory array 200 can be fabricated using standard semiconductor memory fabrication processes familiar to one of ordinary skill in the art, as modified herein. First, CMOS peripheral circuitry (decoders, sense amps, etc.) are fabricated on a wafer. A stack of alternating layers of a conductor and an insulator are deposited. By way of example, alternating layers of doped n-type polysilicon and silicon oxide are deposited, e.g., by chemical vapor deposition. The conducting layers will form the bit lines for the array.

Next, parallel vertical trenches are etched down to the substrate. A conformal deposition technique such as ALD is used to deposit the barrier of a ferroelectric tunnel junction. By way of example, a 4 nm layer of Al2O3 (for the tunnel barriers) followed by an 8 nm layer of Hf0.5Zr0.5O2 (for the ferroelectric layers) are deposited, though any number of combinations of ferroelectric materials, tunnel barrier materials, and multilayers thereof could be used. Finally, another conducting material (e.g., TiN) is deposited in the trenches and patterned into the vertical word lines.

To write data to the memory 250, an electric field is applied across the associated memory cell 260 by applying a voltage (e.g., 6 V) to the word line while grounding the bit line, or vice versa. The electric field should exceed the coercive field of the ferroelectric film in order to reverse its polarization. In order to prevent memory cells sharing the same word or bit line from being disturbed, an inhibit voltage (e.g., 3 V) may be applied to the other word or bit lines so that the electric fields across the unselected cells do not exceed the coercive field of the ferroelectric film.

The memory cell 260 is subsequently read by placing a smaller (e.g., 2 V) voltage across the memory cell and reading the resulting current using sense amplifiers and other peripheral CMOS circuitry well known to those of ordinary skill in the art.

Figure 13:
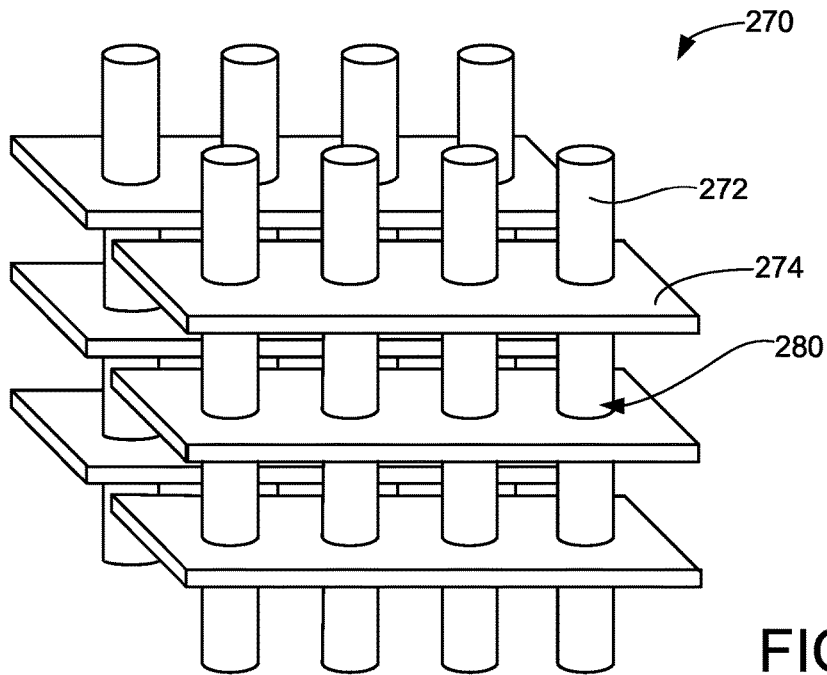
FIG. 13 is a 3D isometric depiction of a vertical FTJ memory in some embodiments.

FIG. 13 provides yet another memory 270 formed from FTJs as described herein. This embodiment utilizes ferroelectric tunnel junctions as the memory cell in an architecture adapted from 3D NAND flash architecture. A cross sectional view is provided in FIG. 14. The memory 270 can be characterized as a 3D vertical FTJ memory.

The memory 270 as depicted has vertically extending, curvilinear (e.g., cylindrically shaped) layers 272 characterized as word lines, and horizontally extending, rectilinear planar layers 274 characterized as bit lines. An FTJ 280 is provided at the intersection of each of these respective members. As an aside, it will be noted that the use of rectilinear or curvilinear members can be modified in each of the various embodiments that have been presented, as can other features, orientations and arrangements. Accordingly, the various embodiments are merely illustrative and not limited.

Figure 14:
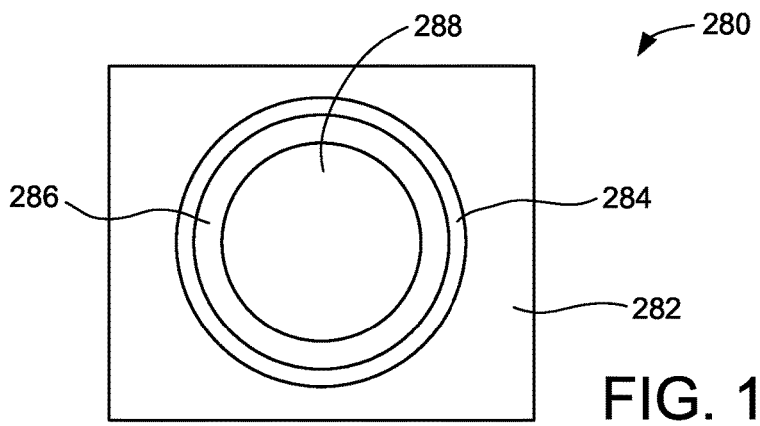
FIG. 14 is a cross-sectional representation of a selected FTJ from FIG. 13.

A selected one of the FTJs 280 is depicted in FIG. 14. Features include a bit line region 282 (corresponding to the horizontal plate layers 274 in FIG. 13), a circumferentially extending tunnel barrier layer 284, a circumferentially extending ferroelectric layer 286, and an interior word line 288 (corresponding to the vertical cylindrical layers 272). The concentric arrangement of FIG. 14 provides a space efficient and effective architecture.

The memory array 270 is fabricated using standard semiconductor memory fabrication processes familiar to one of ordinary skill in the art, as modified herein. First, CMOS peripheral circuitry (decoders, sense amps, etc.) are fabricated on a wafer. A stack of alternating layers of a conductor (e.g., doped polysilicon) and an insulator (e.g., SiO2) are deposited. The conducting layers will form the bit lines for the array.

Next, holes are etched through the entire stack down to the substrate. Slits separating groups of holes from each other may also optionally be etched at this point. At this point, a conformal deposition technique such as ALD is used to deposit the barrier of a ferroelectric tunnel junction. By way of illustration, a 4 nm layer of Al2O3 tunnel barrier layer followed by an 8 nm layer of Hf0.5Zr0.5O2 ferroelectric layer is deposited, though any number of combinations of ferroelectric materials, tunnel barrier materials, and multilayers thereof could be used.

Another conducting material (e.g., TiN) is deposited into the hole array. This conducting material may either entirely fill the rest of the hole or comprise a cylindrical shell concentric with the ferroelectric tunnel junction stack, and in the latter case the central hole may optionally be filled with an insulating material (similar to the Macaroni body vertical transistors used in conventional charge-trapping 3D NAND flash memory). Finally, conducting word lines are deposited and patterns to electrically contact the central conducting electrodes in the memory holes.

To write data, an electric field is applied across the memory cell by applying a voltage (e.g., 5 V) to the word line while grounding the bit line, or vice versa. Depending on the electrical properties of the memory cells, the programming scheme used, and the number and placement of isolation slits, it may be necessary to apply an inhibit voltage to unselected memory cells to prevent program disturb. The memory cell is read by placing a smaller (e.g., 2 V) voltage across the FTJ and reading the resulting current using sense amplifiers and other peripheral CMOS circuitry well known to those of ordinary skill in the art.

The foregoing description of various constructions of memory arrays having FME elements illustrates the ability to incorporate ferroelectric memory into existing chip designs using existing fabrication techniques (adapted of course as described herein). It will be noted that different styles and types of FMEs can provide different advantages for different applications.

Figure 15:
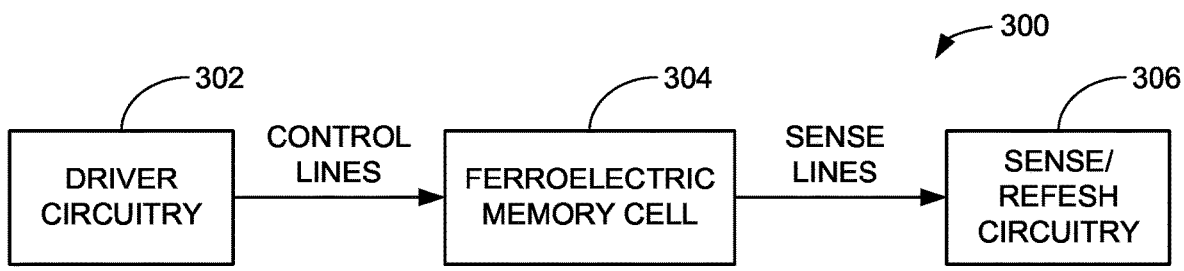
FIG. 15 shows a functional block representation of a ferroelectric memory cell in conjunction with driver circuitry to program the cell and sense circuitry to sense the programmed state of the cell in accordance with some embodiments.

FIG. 15 is a functional representation of a circuit 300 that can be incorporated into the storage device memory 106 of FIG. 1 using any of the above disclosed FME embodiments, or other configurations as desired. The circuit 300 includes driver circuitry 302 which are coupled to and interact with control lines affixed to a ferroelectric memory cell (FME) 304 to provide inputs thereto. Sense/refresh circuitry 306 are similarly coupled to and interact with various control lines (including the same or different control lines used by the driver circuitry 302) to sense the programmed state of the FME 304 and, as required, refresh the same. In this way it will be understood that, as with other types of memory devices, data bits are programmed to the FME cells as required to write data and sensed from the FME cells as required to read and process the previously stored data.

Figure 16:
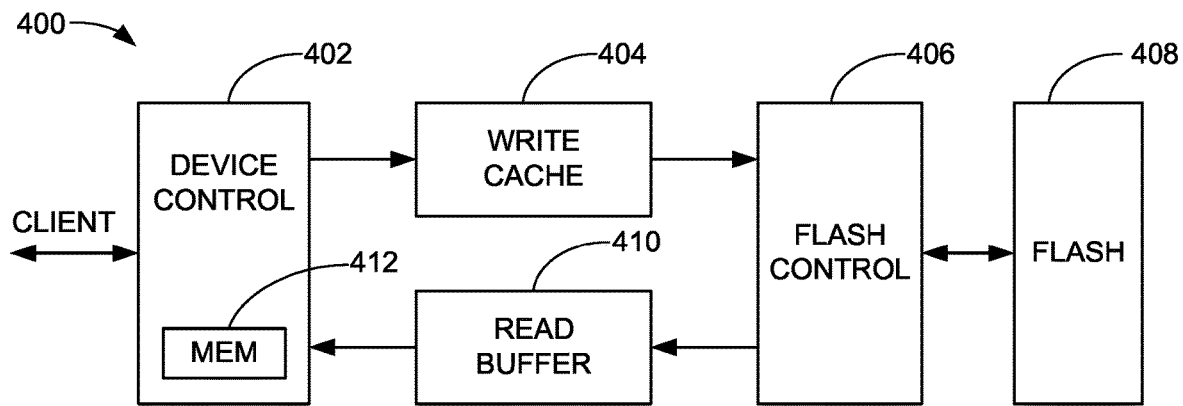
FIG. 16 is a functional block diagram of a data storage device constructed and operated in accordance with various embodiments.

FIG. 16 provides a functional block representation of a data storage device 400 corresponding to the data storage device 102 of FIG. 1 in some embodiments. The purpose of FIG. 16 is to provide a top level view of various data flows that take place through the device as it interacts with the client device 101. Some, many or all of the memory elements depicted in FIG. 16 can be configured as FME elements that essentially operate as described in FIG. 15.

In FIG. 16, the data storage device 400 is characterized as a solid-state drive (SSD) that utilizes flash memory as a main memory store. This is not limiting, as any number of other forms of data storage devices can be utilized, including but not limited to hard disc drives (HDDs), hybrid drives, tape drives, optical drives, magneto-optical (MO) drives, etc.

The SSD 400 includes a device controller 402 that corresponds to the controller 104 in FIG. 1. A write cache 404 is an internal buffer memory that temporarily stores sets of write data provided from the external host prior to transfer to the main store. These sets of write data may accompany a write command from the requesting client to store the data for future use.

A flash memory electronics control circuit 406 receives and processes the sets of write data for transfer to a flash array 408. A read buffer 410 temporarily stores corresponding sets of read back data retrieved from the flash array 408, via the flash control circuit 406, in response to a read command. The read back data are subsequently transferred from the read buffer 410 to the requesting client that issued the read command. Internal controller memory (MEM) 412 may store program instructions, data queues, command queues, map data, and other forms of control data to facilitate these operations.

As noted above, various memory blocks of FIG. 16 can be formed from FMEs in accordance with the foregoing embodiments. These memory blocks can include the write cache 404, the read buffer 410 and/or the embedded memory 412. In addition, aspects of the other portions of the SSD 400, including the flash control 406 and the main memory 408, can incorporate FMEs as described herein.

Figure 17:
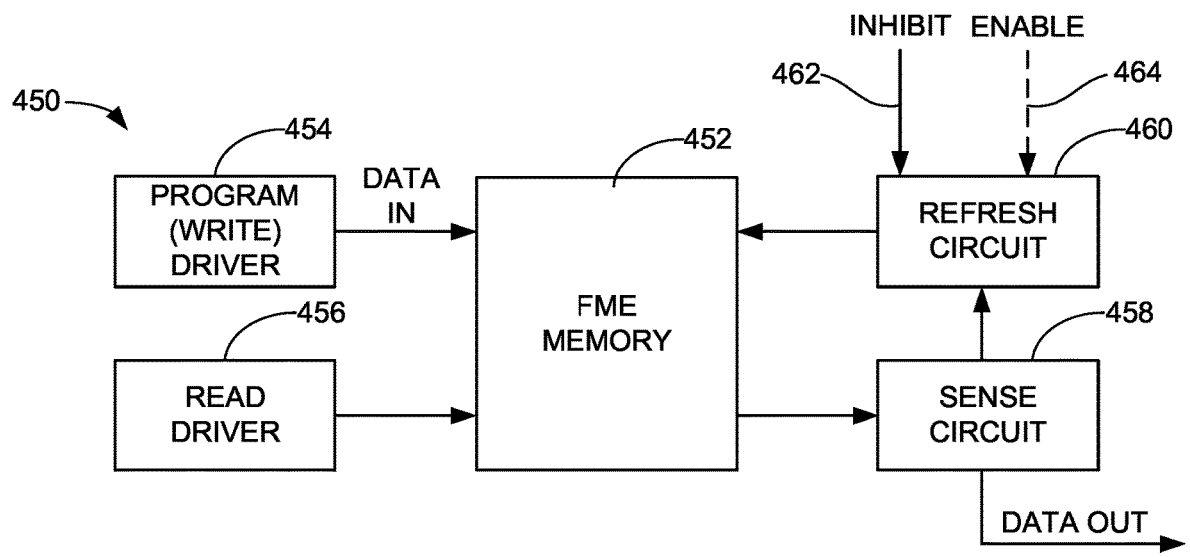
FIG. 17 shows a control circuitry arrangement used to operate an FME based memory in accordance with various embodiments.

FIG. 17 provides a diagrammatical representation of a processing circuit 450 that utilizes an FME based embedded memory 452 constructed and operated in accordance with some embodiments. Without limitation, the circuit 450 can be incorporated into the SSD 400 of FIG. 16.

The FME memory 452 is operated upon by various control circuitry including a program (write) driver circuit 454, a read driver circuit 456, a sense circuit 458 and a refresh circuit 460. The program driver 454 is utilized to write (program) data to the respective memory cells of the FME memory 452. This can include the presentation of appropriate voltages and/or currents on the respective control lines of the individual FME cells to to place the associated ferroelectric layers in the desired programmed orientations. Such write operations may arise as a result of an external write command from an external client. Write operations can also arise as a result of an internal write command resulting from an internal background process initiated by the device controller.

The read driver 456 places appropriate voltages and/or currents on the respective control lines to enable the sense circuit 458 to sense the programmed orientations of the respective FME memory elements, such as during a read operation commanded by an external client or during an internal background read process.

The refresh circuit 460 operates to refresh the current programmed states (orientations of the ferroelectric layers) of the FMEs in the memory 452 at appropriate times. In some cases, the refresh circuit 460 operates at the conclusion of each read operation, since a read operation may destroy the currently stored state. In this situation, once data are read from a selected location in the FMEs, the refresh circuit 460 buffers and rewrites the previously stored data back to that selected location from which the data are retrieved. This may require participation by the write driver circuitry 454 to carry out this refresh operation. Other refresh operations may be carried out as well as part of the background processing applied to the memory 452.

In some embodiments, operation of the refresh circuit 460 is selectively controlled by a controller circuit (e.g., hardware or programmable processor) of the SOC integrated circuit device in which the FME memory 452 is integrated. As such, the refresh circuit 460 may be configured to operate normally to automatically refresh the data read from the FME memory 452 after a read operation, unless an inhibit signal (path 462) is provided to the refresh circuit 460 to instruct the refresh circuit to not rewrite the recovered data back to the FME memory.

The inhibit signal can be supplied in situations where a read operation is intended to be destructive, such as in one-time only reads; power down operations; detections of unauthorized third party attacks and the like upon the system, etc. The inhibit signal 462, also sometimes referred to as a mode select signal, causes any buffered data retrieved from the FME memory 452 to be jettisoned or otherwise not transferred for retention by the FME memory.

In an alternative embodiment, the refresh circuit 460 can be omitted entirely from the circuit 450, or can be configured to normally not be operative after a read unless a specific enable signal (dashed arrow line 464) is supplied. In other words, the FME memory 452 can be configured as desired to either be normally refreshed and selectively not refreshed, or normally not refreshed and selectively refreshed, based on different modes of operation.

Figure 18:
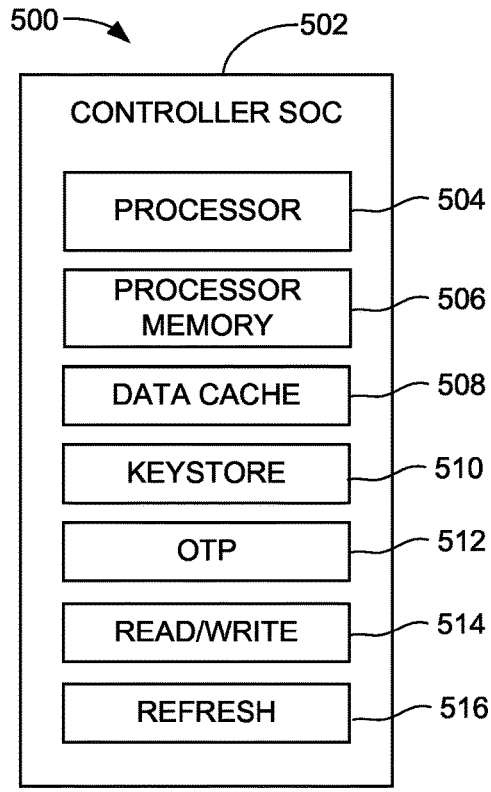
FIG. 18 depicts a controller system on chip (SOC) arrangement that incorporates an FME memory in accordance with some embodiments.

FIG. 18 provides a processing circuit 500 that can be incorporated into various devices discussed above. The processing circuit 500 includes a controller circuit 502 configured as a system on chip (SOC) integrated circuit package. Embedded within the SOC are various circuits including a programmable processor 504, processor memory 506, a data cache 508, a keystore 510 and a one-time programmable (OTP) memory 512. Each of these memory locations can be generated and operated using FMEs., and the entire device 502 can be manufactured using a common set of manufacturing processes.

The use of FMEs for the processor memory 506 provide non-volatility and fast response for the program instructions (firmware, FW), control data and other system parameter data utilized by the processor 504. Pinning data in the memory 506 can provide certain advantages, including a hot boot process during reinitialization during a device boot up (power up) sequence. This can significantly decrease time to ready (TTR) requirements to transition the device 500 from a deactivated state to an active, operationally ready state.

The data cache 508 can provide NVM storage of important data, such as level 1 map data, which can be retained locally. The rewritable in place capabilities of FMEs (e.g., the ability to write new data to existing memory locations without the need to perform an intervening erase operation) allows the data cache to store, inter alia, metadata map data used by the controller to locate and update data in the main memory (e.g., flash 408 in FIG. 16). The data can be retained even during a power down cycle.

In some embodiments, a timer circuit function of the controller (not separately shown in FIG. 18) can evaluate whether the duration of the power down cycle exceeds a predetermined threshold of duration of time, requiring a verification or reloading of the map data. For example, if the device is only powered down for a relatively short period of time, the contents of the data cache (e.g., map data) may be adjudged sufficiently reliable to allow reliance thereon. If the device has been powered down a longer period of time, a reload or verification operation may take place before the data in the data cache can be used as part of the power up processing.

The keystore 510 can be an internal data storage location that cannot be easily accessed by an attacker, and such can store important information such as encryption keys, system data (e.g., certificates, ID values, hash values, etc.). The NVM capabilities of the FMEs can be useful in providing internal maintenance of such data. Power islands can be used to maintain refresh characteristics of the contents of the keystore. In some cases, backup copies of the cryptographic information in the keystore may be stored elsewhere, such as in the main memory (e.g., flash 408), with cryptographic protection and verification techniques applied to ensure validity. The OTP 512 is a one-time-programmable set of memory locations. In the conventional art, these may be protected via fusible links or other mechanisms so that the memory contents are 'burned in' or otherwise permanent, either from a programming standpoint or a destructive standpoint. FMEs are readily useful in such applications. In some cases, an important set of data that can only be accessible internally by the controller, such as an ID value, an internal encryption key, a count of actions taken, etc., can be stored in the OTP 512. Mechanisms can be used to ensure that once data are written to a particular set of FMEs in the OTP, only those values can be refreshed and new values cannot be rewritten. A number of mechanisms can be put into place to maintain the OTP with a set of data bits that cannot be either lost or rewritten. This can include but is not limited to the use of actual mechanical fusible links to the types of processing circuits shown in FIG. 5.

FIG. 18 further shows a read/write circuit 514 and a refresh circuit 516. The read/write circuit 514 can correspond to various circuit elements utilized to carry out read and write operations upon the various memory locations of the controller SOC 502. In one embodiment, the read/write circuit 514 incorporates various circuits such as the write driver 454, read driver 456 and sense circuit 458 in FIG. 17.

The refresh circuit 516 corresponds to various circuit elements utilized to selectively refresh the bits stored to the various FMEs in the SOC 502. As such, the circuit 516 can correspond to circuitry such as the refresh circuit 460 in FIG. 17. It is noted that the refresh circuit 516 can be selectively controlled by the processor 504 to either refresh the memory in a first mode of operation or allow the memory to remain unrefreshed after a read operation, thereby wiping (resetting) the memory, in a second mode of operation. Other operations are contemplated during the second mode of operation, such as the writing of test patterns, dummy data, random patterns, etc. to the FME cells.

The respective first and second modes of operation are enacted by the processor circuit, such as in response to the value of a mode select signal supplied thereby to the refresh circuit. While not limiting, the first mode of operation may be characterized as a normal mode of operation that is routinely carried out during normal operation of the device. The second mode of operation may be characterized as an exception mode of operation where an exception condition has been detected, and therefore at least selected contents of the FME cells need to be wiped, overwritten, or otherwise not retained.

Figure 19:
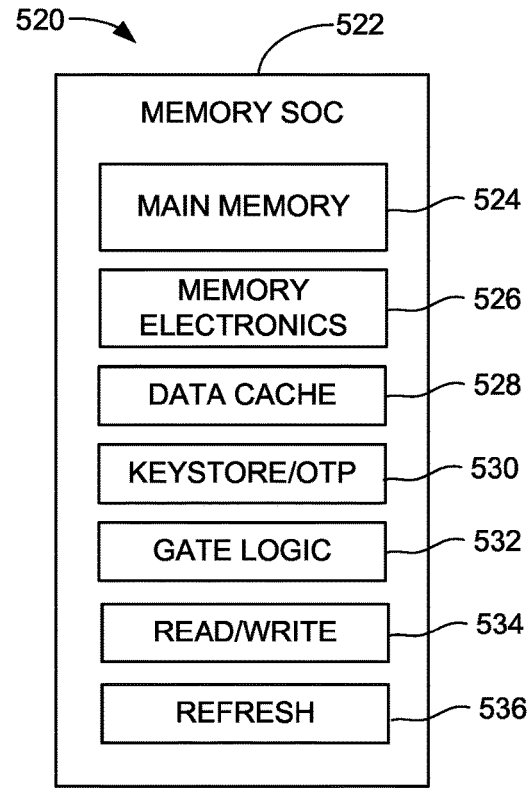
FIG. 19 depicts a memory SOC arrangement that incorporates an FME memory in accordance with some embodiments.

FIG. 19 is a functional representation of aspects of another data storage device 520 having a memory SOC 522 in accordance with some embodiments. The memory SOC 522 is similar to the controller SOC 502 described above in FIG. 18, except that the primary functionality of the SOC 522 in FIG. 19 is to provide memory operations rather than system controller operations. It will be understood at this point that any number of different types of SOC devices can be utilized in accordance with various embodiments of the present disclosures that utilize ferroelectric memory elements to carry out various functions. As used herein, the term SOC will include integrated circuit packages with a hardware and/or programmable processor architecture adapted to use the associated ferroelectric memory elements.

The memory SOC 522 is shown to include a main memory 524, memory electronics 526, a data cache 528, a keystore/OTP 530 and gate logic 532. Other configurations can be used so that some or all of these elements can be omitted and other elements added. As before, the main memory 524 provides a main NVM store for user data from a selected client (host) device. The memory electronics 526 can include rudimentary or advanced processing functions to control exchanges with the main NVM store and/or with other aspects of the SOC device.

The data cache 528, keystore/OTP 530, and gate logic 532 operate as described above. Any number of the designated elements can be advantageously formed of ferroelectric memory elements, including but not limited to the main NVM store 524, the data cache 528 and/or the keystore/OTP 530. As before, the SOC 522 has a read/write circuit 534 adapted to write and read data to and from the various memory locations, and a selectable refresh circuit 536 that may or may not refresh the memory locations after a read depending on inputs supplied by processor circuitry (e.g., the memory electronics 526, the gate logic 532, etc.).

Figure 20:
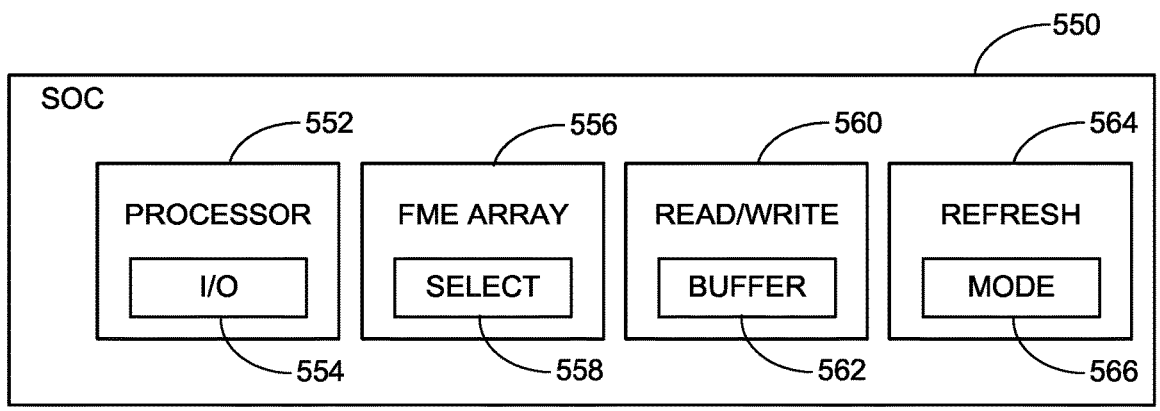
FIG. 20 shows yet another SOC in accordance with some embodiments.

FIG. 20 is a functional representation of yet another SOC circuit 550 that can be adapted for use as described above. The SOC circuit 550 includes a hardware or programmable processor 552 with an input/output (I/O) block 554 to facilitate communications internally or externally as required. An FME array 556 is made up of FME cells as described herein and includes select logic 558 to facilitate interconnection and access operations.

A read/write circuit 560 includes various write, read and sense drivers to interact with the select logic 558 to access the various FMEs, as well as one or more data buffers 562 to temporarily store data between transferred between the FME array 556 and another device/circuit. A refresh circuit 564 operates as discussed above in accordance with mode logic 566 to rewrite data back to the FME cells after a normal read operation (such as via transfer from the buffers 562) or to forego such refresh operations and permit the FMEs to remain in the reset state after such read operations.

It will now be appreciated that the various embodiments of the present disclosure provide a number of benefits over the existing art. The use of ferroelectric layers and structures in a number of novel FeRAM, FeFET and FTJ arrangements as disclosed herein can provide numerous cost effective, compact and fast performance memory applications. Some embodiments have been presented in the context of a DRAM substitute, so that the various memory arrays could be readily incorporated into an existing integrated circuit application such as an SOC to provide local fast and reliable memory for a processor. Other applications are envisioned and disclosed, such as main memory for a data storage device (e.g., as a replacement for NOR or NAND flash in an SSD or hybrid data storage device), a data cache, a RAID controller storage space, a mass storage environment, a cloud computing environment, an edge computing environment, a portable USB storage device, an IoT device, local memory for a portable storage device (e.g., smart phone, tablet, laptop), etc.

Incorporating FME memory into an SOC as disclosed herein enables complex, dense and reliable NVM elements to be incorporated into an integrated design using the same or similar fabrication technologies and techniques used to form the other elements in the design. At the same time, such incorporation allows the integrated processing circuits in the SOC to have selective capabilities to inhibit or enable refresh circuitry to refresh (or not) data read from the FME memory under a wide variety of different types of conditions including power down, crypto, attack detection, security, OTP, and other applications.

It is contemplated that a read verification operation can be carried out to ensure the data have been properly stored, after which the data cannot be rewritten to the FME cells after a normal read operation to recover the contents. In this example, the read verify could be viewed as a first mode and the inhibiting of future reads viewed as a second mode. Incorporating the processor and the FMEs into an SOC enhances security aspects, cost, power and efficiency of the design, particularly when the FMEs are used to store cryptographic (security) information.

The terms "horizontal" and "vertical" as used herein will be understood as relative terms with regard to relative orthogonality and do not necessarily require absolute orientation with respect to the center of the earth. Accordingly, horizontal and vertical elements can be oriented in any respective orientations so long as the respective elements are nominally orthogonal to one another in the context in which these terms are used. The term SOC and the like will be understood as a specially configured integrated circuit package with a processor and associated memory utilized by the processor.

It is to be understood that even though numerous characteristics and advantages of various embodiments of the present disclosure have been set forth in the foregoing description, this description is illustrative only, and changes may be made in detail, especially in matters of structure and arrangements of parts within the principles of the present disclosure to the full extent indicated by the broad general meaning of the terms wherein the appended claims are expressed.

What is claimed is:

1. A system on chip (SOC) integrated circuit device, comprising:
    a processor circuit;
    a ferroelectric memory formed of an array of ferroelectric memory elements (FMEs) characterized as non-volatile, read-destructive semiconductor memory cells each having at least one ferroelectric layer;
    a read/write circuit configured to write data to the FMEs and to subsequently read back data from the FMEs responsive to respective write and read signals supplied by the processor circuit; and
    a refresh circuit configured to selectively refresh the FMEs in a first mode and to not refresh the FMEs in a second mode responsive to a mode selection signal from the processor circuit, wherein the refresh circuit is further configured to receive an inhibit signal in the second mode and in response to receiving the inhibit signal disable the refresh the FMEs.

2. The SOC of claim 1, wherein the refresh circuit refreshes the FMEs in the first mode by rewriting the data read back from the FMEs by the read/write circuit after a read operation directed by the processor circuit.

3. The SOC of claim 2, wherein the read/write circuit transfers the read back data to a buffer memory, and wherein the refresh circuit transfers a copy of the read back data in the buffer memory to the FMEs.

4. The SOC of claim 1, wherein the read back data from the FMEs recovered by the read/write circuit after a read operation are not returned to the FMEs.

5. The SOC of claim 1, wherein the refresh circuit operates in the second mode to not refresh the FMEs responsive to a power down event detected by the processor circuit in which external electrical power is removed from the SOC.

6. The SOC of claim 1, wherein the refresh circuit operates in the second mode to not refresh the FMEs responsive to use of a selected number of the FMEs as one-time programmable (OTP) memory elements to store security information that can only be read once from the OTP memory elements.

7. The SOC of claim 1, wherein the refresh circuit operates in the second mode to not refresh the FMEs responsive to a detected security breach attack upon the SOC by the processor circuit.

8. The SOC of claim 1, further comprising a buffer memory into which recovered readback data are stored responsive to a read operation by the read/write circuit upon the ferroelectric memory.

9. The SOC of claim 8, wherein during the first mode the refresh circuit transfers a copy of the recovered readback data back to the ferroelectric memory, and wherein during the second mode the refresh circuit does not transfer a copy of the recovered readback data back to the ferroelectric memory.

10. The SOC of claim 1, wherein the FMEs of the ferroelectric memory are arranged as ferroelectric field effect transistors (FeFETs).

11. A data storage device, comprising:
a non-volatile memory (NVM) arranged as a main store for user data;
a controller configured to perform data transfer operations to transfer the user data between the NVM and an external client; and
a local memory accessed by the controller during the data transfer operations, the local memory comprising an array of ferroelectric memory elements (FMEs) characterized as non-volatile, read-destructive semiconductor memory cells each having at least one ferroelectric layer, the controller reading data stored in the FMEs and inhibiting a read-refresh operation thereon responsive to a selected condition, the controller and the local memory incorporated into a system on chip (SOC) integrated circuit device,
wherein the local memory further comprises a read/write circuit configured to write data to and read data from the FMEs and a refresh circuit configured to selectively refresh the data read from the FMEs by the read/write circuit responsive to a mode selection input signal supplied by the controller, wherein the refresh circuit is further configured to receive an inhibit signal in a second mode and in response to receiving the inhibit signal disable the refresh the FMEs.

12. The data storage device of claim 11, wherein the controller is a programmable processor which operates responsive to firmware program instructions stored in a memory of the SOC integrated circuit device.

13. The data storage device of claim 11, wherein the FMEs are characterized as a selected one of FeRAM, FeFET or FTJ ferroelectric memory cells.

14. The data storage device of claim 11, wherein the FMEs normally operate in a first mode such that the FMEs are refreshed responsive to a read operation thereon during a normal operational mode of the data storage device, and wherein the FMEs operate in the second mode selected by the controller responsive to detection of an exception condition in which the FMEs are not refreshed responsive to a read operation thereon.

15. The data storage device of claim 14, wherein the read back data from the FMEs recovered by the read/write circuit after a read operation are not returned to the FMEs.

16. The data storage device of claim 11, further comprising inputting the inhibit signal into the refresh circuit in response to a power down operation.

17. The data storage device of claim 11, further comprising inputting the inhibit signal into the refresh circuit in response to detection of an unauthorized third party attack on the data storage device.

18. The data storage device of claim 11, further comprising inputting the inhibit signal into the refresh circuit in response to determining that a read operation on the FMEs is a destructive read operation.

* * * * *